United States Patent
Agam et al.

(10) Patent No.: US 8,530,283 B2
(45) Date of Patent: Sep. 10, 2013

(54) PROCESS FOR FORMING AN ELECTRONIC DEVICE INCLUDING A NONVOLATILE MEMORY STRUCTURE HAVING AN ANTIFUSE COMPONENT

(75) Inventors: Moshe Agam, Portland, OR (US); Thierry Coffi Herve Yao, Portland, OR (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 9 days.

(21) Appl. No.: 13/232,568

(22) Filed: Sep. 14, 2011

(65) Prior Publication Data

US 2013/0062698 A1 Mar. 14, 2013

(51) Int. Cl.
*H01L 21/82* (2006.01)
*H01L 23/525* (2006.01)

(52) U.S. Cl.
CPC ................................ *H01L 23/5252* (2013.01)
USPC .............. 438/131; 257/50; 257/530; 257/368

(58) Field of Classification Search
USPC .................. 257/50, 209, 213, 288, 326, 368, 257/388, 529, 530, 903, E23.147, E21.66, 257/E21.09, E21.645; 438/131, 211, 215, 438/253, 281, 460, 467, 584, 585, 600; 365/51, 365/94, 104, 185, 187, 225.7
See application file for complete search history.

(56) References Cited

U.S. PATENT DOCUMENTS

| | | | |
|---|---|---|---|
| 6,507,053 B1 | 1/2003 | Bernard et al. | |
| 6,927,997 B2 | 8/2005 | Lee et al. | |
| 7,046,569 B2 | 5/2006 | Ito et al. | |
| 7,102,951 B2 | 9/2006 | Paillet et al. | |
| 7,277,348 B2 | 10/2007 | Peng et al. | |
| 7,280,425 B2 * | 10/2007 | Keshavarzi et al. | 365/225.7 |
| 7,402,855 B2 | 7/2008 | Kurjanowicz | |
| 7,489,535 B2 | 2/2009 | Mallikararjunaswamy | |
| 7,511,982 B2 | 3/2009 | Kurjanowicz et al. | |
| 7,602,029 B2 | 10/2009 | Mallikararjunaswamy | |

(Continued)

FOREIGN PATENT DOCUMENTS

WO 2006121828 A2 11/2006

OTHER PUBLICATIONS

U.S. Appl. No. 13/232,487, filed Sep. 14, 2011, "Electronic Device Including a Nonvolatile Memory Structure Having an Antifuse Component and a Process of Forming the Same", Inventors: Moshe Agam et al.

(Continued)

*Primary Examiner* — Tom Thomas
*Assistant Examiner* — John Bodnar (57) ABSTRACT

An electronic device can include a nonvolatile memory cell, wherein the nonvolatile memory cell can include an access transistor, a read transistor, and an antifuse component coupled to the access transistor and the read transistor. In an embodiment, the read transistor can include a gate electrode, and the antifuse component can include a first electrode and a second electrode overlying the first electrode. The gate electrode and the first electrode can be parts of the same gate member. In another embodiment, the access transistor can include a gate electrode, and the antifuse component can include a first electrode, an antifuse dielectric layer, and a second electrode. The electronic device can further include a conductive member overlying the antifuse dielectric layer and the gate electrode of the access transistor, wherein the conductive member is configured to electrically float. Processes for making the same are also disclosed.

20 Claims, 4 Drawing Sheets

(56) References Cited

U.S. PATENT DOCUMENTS

| | | |
|---|---|---|
| 7,613,913 B2 | 11/2009 | Haban et al. |
| 7,764,532 B2 | 7/2010 | Kurjanowicz et al. |
| 7,764,541 B2 | 7/2010 | Kohler et al. |
| 7,817,456 B2 * | 10/2010 | Kurjanowicz ................... 365/96 |
| 2011/0278656 A1 * | 11/2011 | Chang et al. .................. 257/306 |

OTHER PUBLICATIONS

U.S. Appl. No. 13/232,745, filed Sep. 14, 2011, "Electronic Device Including a Nonvolatile Memory Structure Having an Antifuse Component and a Process of Using the Same", Inventors: Moshe Agam et al.

* cited by examiner

PROCESS FOR FORMING AN ELECTRONIC DEVICE INCLUDING A NONVOLATILE MEMORY STRUCTURE HAVING AN ANTIFUSE COMPONENT

FIELD OF THE DISCLOSURE

The present disclosure relates to electronic devices and processes of forming electronic devices, and more particularly to, electronic devices including a nonvolatile memory cell and processes of forming the same.

RELATED ART

Electronic devices can include nonvolatile memory cells. The nonvolatile memory cells include one-time programmable ("OTP") memory cells with an antifuse component. Before programming, the antifuse component is in an open or relatively high resistive state, and after programming, the antifuse component is in a relatively conductive state (as compared to before programming). In addition to the antifuse component, the nonvolatile memory call can include a read transistor, where a source region, a drain region, or a source/drain region of the read transistor is electrically connected to a terminal of the antifuse component. During programming and reading of the memory cell, current flows through the read transistor and antifuse component.

BRIEF DESCRIPTION OF THE DRAWINGS

Embodiments are illustrated by way of example and are not limited in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application. While numerical ranges are described herein to provide a better understanding of particular embodiments, after reading this specification, skilled artisans will appreciate that values outside the numerical ranges may be used without departing from the scope of the present invention.

The term "coupled" is intended to mean a connection, linking, or association of two or more electronic components, circuits, systems, or any combination of: (1) at least one electronic component, (2) at least one circuit, or (3) at least one system in such a way that a signal (e.g., current, voltage, or optical signal) may be transferred from one to another. A non-limiting example of "coupled" can include a direct electrical connection between electronic component(s), circuit(s) or electronic component(s) or circuit(s) with switch(es) (for example, transistor(s)) connected between them. Thus, an electrical connection is a specific type of coupling; however, not all couplings are electrical connections.

The term "source/drain region" is intended to mean a source region, a drain region, or a doped region that, depending on biasing conditions, may be a source region or a drain region.

The terms "comprises," "comprising," "includes," "including," "has," "having," or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read such that the plurals include one or at least one and the singular also includes the plural, unless it is clear that it is meant otherwise. For example, when a single item is described herein, more than one item may be used in place of a single item. Similarly, where more than one item is described herein, a single item may be substituted for that more than one item.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

An electronic device can include a nonvolatile memory ("NVM") cell, wherein the NVM cell can include an antifuse component, an access transistor, and a read transistor having a control electrode. In a particular embodiment, the NVM cell can be an OTP cell, and the antifuse component can be in the form of a capacitor. As described in detail below, process flows and structures for the NVM cell are described. A double polysilicon process can be used. Such a process can be useful for reducing the size of the NVM cell. In a particular embodiment, the antifuse component can be formed over the channel region of a transistor within the NVM cell. The physical design of the cell is flexible, and, when incorporated into an NVM array, the physical design can be tailored to the number of interconnect levels in an existing process flow. The physical designs and processes are better understood after reading the remainder of the detailed description.

Figure 1:
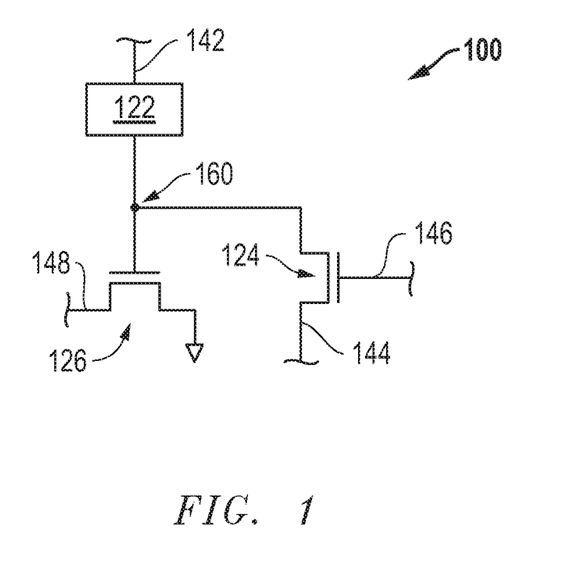
FIG. 1 includes a circuit diagram of a nonvolatile memory cell that includes an antifuse component, an access transistor, and a read transistor in accordance with an embodiment.

FIG. 1 includes a circuit diagram of a NVM cell 100 that includes an antifuse component 122, an access transistor 124, and a read transistor 126 in accordance with an embodiment. The NVM cell 100 can be part of a memory array or may be an individual memory cell not within a memory array. In a particular embodiment, the antifuse component 122 has a pair of terminals, the access transistor 124 has a pair of current terminals and a control electrode, and the read transistor 126 has a pair of current terminals and a control electrode. In the embodiment as illustrated, the antifuse component 122 is coupled to a word line 142 or to a terminal that provides a control signal towards the control electrode of the read transistor 126 during a read operation. The other terminal of the antifuse component 122 is coupled to a current terminal of the access transistor 124 and the control electrode of the read transistor 126 at node 160. The other current terminal of the access transistor 124 is coupled to a program line 144 or to a $V_{SS}$ terminal or a ground terminal. The control terminal of the access transistor 124 is coupled to an access line 146 or a terminal that controls when a programming current flows through the antifuse component 122. One of the current terminals of the read transistor 126 is coupled to a bit line or a terminal coupled to an amplifier or another circuit used in determining the programming state (programmed or unprogrammed) of the NVM cell 100. The other current terminal of the read transistor 126 is coupled to a ground terminal or a $V_{SS}$ terminal.

In a particular embodiment, any one or more of the couplings can be replaced by one or more electrical connections. One of the terminals of the antifuse component 122 is electrically connected to the word line 142 or to a terminal that provides a control signal towards the control electrode of the read transistor 126 during a read operation. The other terminal of the antifuse component 122, the current terminal of the access transistor 124, and the control electrode of the read transistor 126 can be electrically connected at a node 160. The other current terminal of the access transistor 124 can be electrically connected to the program line 144 or to the $V_{SS}$ terminal or the ground terminal. The control terminal of the access transistor 124 can be electrically connected to the access line 146 or the terminal that controls when the programming current flows through the antifuse component 122. One of the current terminals of the read transistor 126 can be electrically connected to the bit line 148 or the terminal coupled to the amplifier or the other circuit used in determining the programming state (programmed or unprogrammed) of the NVM cell 100. The other current terminal of the read transistor 126 can be electrically connected to the ground terminal or the $V_{SS}$ terminal.

Figure 2:
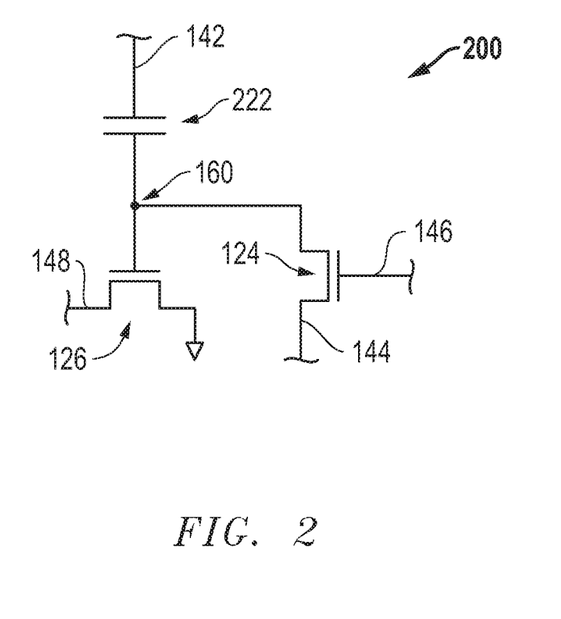
FIG. 2 includes a circuit diagram of a nonvolatile memory cell that includes an antifuse component in the form of a capacitor, an access transistor, and a read transistor in accordance with an embodiment.

FIG. 2 includes an illustration of an embodiment that is particularly well suited for a double polysilicon process flow. The nonvolatile memory cell 200 in FIG. 2 is substantially the same as the nonvolatile memory cell 100 in FIG. 1, except that the antifuse component 122 is in the form of a capacitor 222. In the embodiment as illustrated, the access and read transistors 124 and 126 are n-channel transistors.

Referring to FIG. 2, the NVM cell 200 can be programmed when the NVM cell is properly biased. The voltage difference between the word line 142 and the program line 144 can be a programming voltage, $V_{PP}$. In an embodiment, the word line 142 can be at approximately $V_{PP}$, and the program line 144 can be at approximately 0 volts. In another embodiment, the word line 142 can be at approximately $+\frac{1}{2} V_{PP}$, and the program line 144 can be at approximately $-\frac{1}{2} V_{PP}$.

The access transistor 124 is on during programming, and thus, a signal provided on the access line 146 to the gate electrode of the access transistor 124 is sufficient to turn on the access transistor 124. In a particular embodiment, the gate electrode of the access transistor 124 is at approximately $V_{DD}$ when on, and at approximately 0 volts when off. Other voltages for turning on and off the access transistor 124.

During programming, the bit line 148 is at approximately ground or 0 volts. Substantially no current flows through the read transistor 126 during a programming operation because the source and drain regions of the transistor 126 are at substantially the same voltage.

When the NVM cell 200 is programmed, the capacitor 222 is changed to a state that more similar to a resistor. The antifuse dielectric layer of the capacitor 222 no longer substantially prevents current from flowing between the electrodes of the capacitor 222. Thus, significant current can flow through the antifuse dielectric layer.

Note that within the NVM cell 200, during programming, the current flows through the capacitor 222 and the access transistor 124. The current path with the access transistor 124 allows the programming current to bypass the read transistor 126, and thus, damage to the read transistor 126 during programming is substantially reduced. Compare the NVM cell 200 to a conventional NMV cell having an antifuse component and a read transistor electrically connected in series. During a programming operation of an array of conventional NVM cells, the gate dielectric layer of a selected cell, an unselected cell, or a combination of selected and unselected cells may be exposed to relatively high voltages while current is flowing through the read transistor. Such a condition may cause charge to become trapped or cause another gate dielectric degradation mechanism to occur within the read transistor. Thus, one or more conventional NVM cells within the array may fail during programming or have significantly reduced expected lifetime (as measured by the number of programming operations, read operations, or a combination of programming and read operations).

During a read operation of the NVM cell 200, the word line 142 and the bit line 148 are at approximately $V_{DD}$, and the program line 144 and access line 146 are at approximately 0 volts. In another embodiment, different voltages may be used. For example, the word line 142 may be at a higher voltage as compared to the bit line 148. Further, the program line 142 may be at substantially the same voltage as compared to the word line 142, to reduce leakage current through the access transistor 124, as the access transistor 124 is in an off state during a read operation.

When the NVM cell 200 is programmed, significant current can be detected at the bit line 148, and when the NVM cell is unprogrammed, a substantially lower current or no significant current is detected at the bit line 148. The programmed NVM cells can have a significant drain current at word line voltages of approximately 0.5 V and higher. $I_{dsat}$ for the programmed NVM cells may be greater than $10^{-4}$ amperes, whereas $I_d$ for the unprogrammed NMV cells may be less than $10^{-10}$ amperes. A binary distribution of I-V characteristics will occur between the programmed and unprogrammed NVM cells.

Exemplary physical designs and process flows that can be used to form the NVM cell 200 are described below in more details. The particular physical designs and process flows are illustrative and not mean to limit the scope of the present invention.

Figure 3:
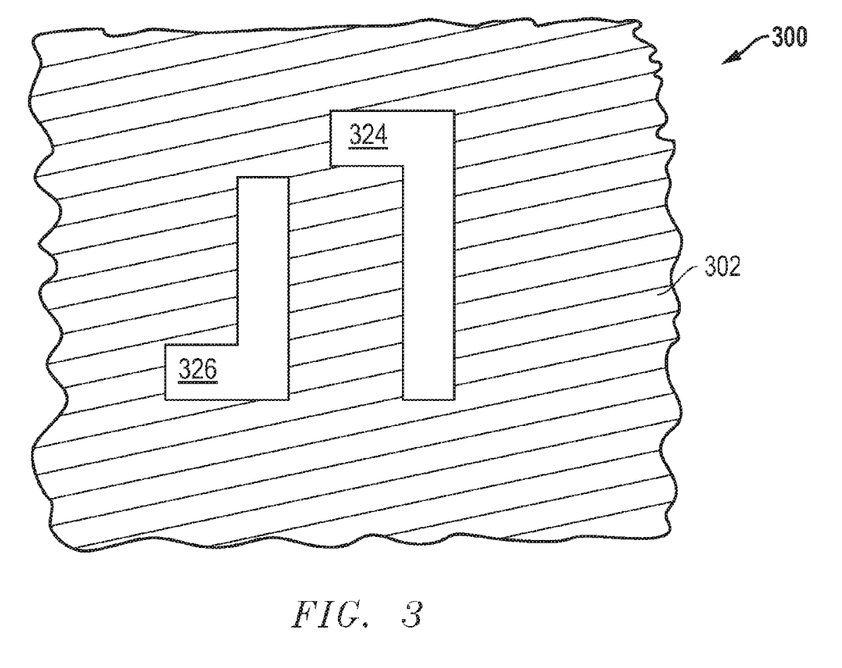
FIG. 3 includes an illustration of a top view of a portion of a workpiece that includes a field isolation region and active regions.

FIG. 3 includes a top view of a portion of an electronic device 300. As illustrated in FIG. 3, a portion of an NVM array is illustrated where an NVM cell is being formed. A field isolation region 302 is formed within or from a portion of a substrate to define active regions 324 and 326. The substrate can include a semiconductor material such as silicon, germanium, carbon, another semiconductor material such as a III-V or a II-VI material, or any combination thereof. The substrate may be in the form of a substantially monocrystalline wafer or a semiconductor-on-insulator substrate. The field isolation region 302 may be formed using a shallow trench isolation process, a local oxidation of silicon process, or another suitable process. The active regions 324 and 326 can include portions of the substrate where the field isolation region 302 is not formed. The access transistors of the NVM cell will be at least partly formed within the active region 324, and the read transistors of the NVM cell will be at least partly formed within the active region 326.

One or more well doping steps may be performed. In an embodiment, the substrate can include a p-type dopant. In another embodiment, the substrate can include an n-type dopant, and a p-well doping step may be performed to make the active regions 324 and 326 p-type doped. In a further embodiment, the active regions 324 and 326 have the same conductivity type. Threshold adjust doping operations may be performed is needed or desired.

One or more gate dielectric layers can be formed over the active regions 324 and 326. In an embodiment, the gate dielectric layer has substantially the same composition and substantially the same thickness over the active regions 324 and 326. In another embodiment, more than one gate dielectric layer is formed. The gate dielectric layers may have different compositions or thicknesses for the different active regions. In a particular embodiment, the gate dielectric layers have substantially the same composition, and the gate dielectric layer over the active region 324 has a different thickness as compared to a different gate dielectric layer over the active region 326. The gate dielectric layer(s) over the active regions 324 and 326 may have a thickness no greater than approximately 10 nm or no greater than 9 nm. In a particular embodiment, the gate dielectric layer(s) over the active regions 324 and 326 has a thickness in a range of approximately 7 nm to approximately 8 nm.

A gate electrode layer is formed over the field isolation regions 302, active regions 324 and 326 (in FIG. 3), and gate dielectric layer(s). The gate electrode layer can include can include a semiconductor-containing or metal-containing film. In one embodiment, the gate electrode layer includes polysilicon or amorphous silicon deposited by a chemical vapor deposition process, but may include another material or may be deposited by another process in another embodiment. In one embodiment, the gate electrode layer is doped when deposited, and in another embodiment, is doped after it is deposited. In a finished device, the gate electrode layer has a dopant concentration of at least $10^{19}$ atoms/cm$^3$ when the gate electrode layer includes polysilicon or amorphous silicon. In another embodiment, the gate electrode layer can include a metal-containing film in conjunction with or in place of the semiconductor-containing film. The metal-containing film can include a refractory metal (by itself), a refractory metal alloy, a refractory metal silicide, a refractory metal nitride, a refractory metal carbide, or any combination thereof.

An antifuse dielectric layer can be formed over the gate electrode layer. In an embodiment, the antifuse dielectric layer has substantially the same composition and substantially the same thickness as the gate dielectric layer(s) over the active regions 324 and 326. In another embodiment, the antifuse dielectric layer may have a different composition, a different thickness or both as compared to the gate dielectric layer(s) overlying the active regions 324 and 326. The antifuse dielectric layer may have a lower breakdown voltage as compared to the gate dielectric layer(s). In a particular embodiment, the antifuse dielectric layer may include more than one film. For example, a film can be formed by thermally oxidizing a portion of the gate electrode layer, and another film can be deposited using a silicon-containing source gas, such as silane, disilane, or the like, and a gas including nitrogen, oxygen, or both, such as NO. The antifuse dielectric layer may have a thickness no greater than approximately 9 nm, no greater than approximately 7 nm, or no greater than 5 nm. In an embodiment, the antifuse dielectric layer can have a thickness of at least approximately 0.5 nm. In a particular embodiment, the antifuse dielectric layer may have a thickness of at least approximately 3 nm or no more than approximately 5 nm.

A conductive layer is formed over the antifuse dielectric layer. The conductive layer may include any of the materials as described with respect to the gate electrode layer. In an embodiment, the conductive layer and the gate electrode layer can have substantially the same thickness and substantially the same composition. In another embodiment, the conductive layer can have a different thickness, a different composition, or both as compared to the gate electrode layer. The conductive layer may have the same number or a different number of films as compared to the gate electrode layer.

Figure 4:
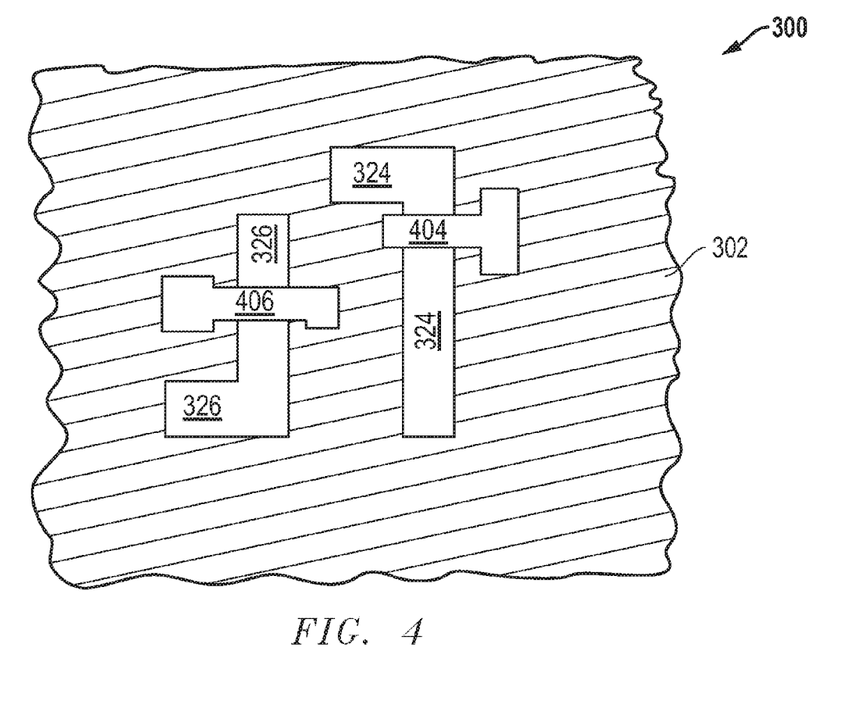
FIG. 4 includes an illustration of a top view of the workpiece of FIG. 3 after forming gate stacks.

FIG. 4 includes a top view of the electronic device 300 after forming gate stacks 404 and 406. A masking layer is formed over the conductive layer and patterned to correspond to the shapes of the gate stacks 404 and 406. The conductive layer, the antifuse dielectric layer, and the gate electrode layer are sequentially etched to form the gate stacks 404 and 406. The gate dielectric layer(s) may or may not be etched at this time. The masking layer is removed. Outside the memory array, gate stacks are formed at locations where logic and other transistors are formed. FIG. 4 illustrates positional relationships between the gate stacks 404 and 406 and the active regions 324 and 326 in accordance with an embodiment.

The gate stacks, including gate stacks 404 and 406, include gate members and conductive members. At this point in the process, conductive members of the gate stacks 404 and 406 can be seen in FIG. 4. The conductive members overlie and, from a top view, have substantially the same shape as their corresponding gate members (not seen in FIG. 4). Within the gate stack 404, the gate member includes the gate electrode for the access transistors and an electrode of the antifuse component, and the conductive member includes another electrode of the antifuse component. Within the gate stack 406, the gate member includes the gate electrode for the read transistor.

Figure 5:
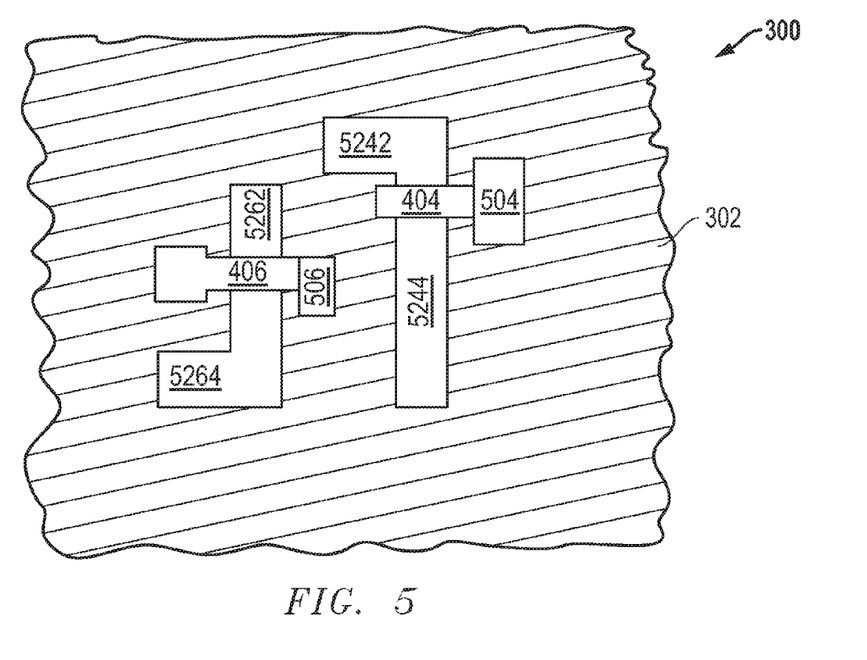
FIG. 5 includes an illustration of a top view of the workpiece of FIG. 3 after removing portions of a conductive layer overlying contact regions of underlying gate members, and after forming source/drain regions.

FIG. 5 includes a top view of the electronic device 300 after removing portions of conductive members from the gate stacks 404 and 406 and after forming doped regions, as later described in more detail. A masking layer is formed over the gate stacks 404 and 406, active regions 324 and 326 (in FIG. 4), and field isolation region 302 and is patterned. Within the memory array, openings in the masking layer correspond to locations of contact regions 504 and 506 of the gate members of gate stacks 404 and 406, respectively. Outside the memory array, substantially all of the conductive layer is to be removed, and, therefore, substantially none of the masking layer overlies the conductive layer outside the memory array after the masking layer is patterned. The conductive layer is etched. The antifuse dielectric layer may or may not be etched at this time. The masking layer is removed. The contact regions 504 and 506 of the gate members of gate stacks 404 and 406 are no longer covered by the conductive layer. Within each of the gate stacks 404 and 406, the conductive member and the gate member has substantially the same shape except for the contact region of the gate member.

Doping sequences are performed to form source/drain regions. A drain region 5242 of the access transistor will be coupled to the gate member of the gate stack 406 at the contact region 506, and a source region 5244 of the access transistor will be coupled to a subsequently-formed program line. A drain region 5262 of the read transistor will be coupled to a subsequently-formed bit line, and a source region 5264 of the read transistor will be coupled to a subsequently-formed ground terminal. In a particular embodiment, each of the couplings can be in the form of electrical connections. In an embodiment, the drain region 5242, source region 5244, drain region 5262, and source region 5264 are n-type doped. The peak dopant concentration for each of the drain regions 5242, source regions 5244, drain regions 5262, and source regions 5264 is at least $10^{19}$ atoms/cm$^3$.

Figure 6:
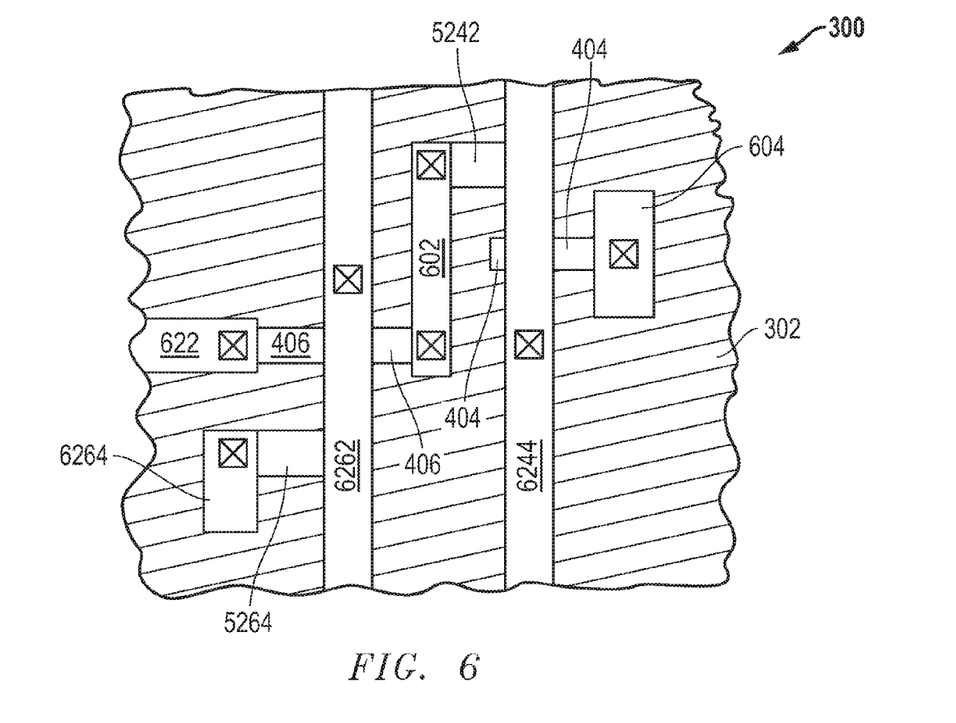
FIG. 6 includes an illustration of a top view of the workpiece of FIG. 5 after forming an interconnect level including interconnect members.

FIG. 6 includes an illustration of a top view of the electronic device 300 after forming an interconnect level that includes interconnect members. An interlevel dielectric ("ILD") layer can be formed over the gate members 404 and 406, the field isolation region 302, and the active regions that include the drains, source, and source/drain regions as previously described. The ILD layer can include a single oxide film or a plurality of insulating films. The plurality of insulating films can include an etch-stop film, a polish-stop film, an antireflective film, a bulk oxide film, another suitable insulating film, or any combination thereof. The ILD layer can be patterned to define contact openings to gate members 406 and 404, drain, source, and source/drain regions within the active regions, and other portions of the electronic device 300 (not illustrated). A conductive layer can be formed and patterned to form the interconnect members 602, 622, 604, 6244, 6262, and 6264. The conductive layer can include a single conductive film or a plurality of conductive films. The plurality of conductive films can include a barrier film, an adhesion film, an antireflective film, a bulk conductive film, another conductive suitable film, or any combination thereof. The interconnect members may be used with or without conductive plugs, using a single inlaid or dual inlaid process, or the like. Similar to the interconnect members, the conductive plugs can include a single conductive film or a plurality of conductive films. The plurality of conductive films can include a barrier film, an adhesion film, an antireflective film, a bulk conductive film, another conductive suitable film, or any combination thereof. The Xs within boxes note where interconnect members make electrical connections to an underlying features. The interconnect members may have contact portions that extend into the ILD layer and directly contact the underlying features or may overlie conductive plugs that directly contact the underlying features. In this specification, corresponding contacts refer to such contact potions of the interconnect members or such conductive plugs.

The interconnect member 602 is electrically connected to the gate members of gate stack 404 and the drain region 4242 of the access transistor, and thus, complete the formation of nodes, including node 160 as illustrated in FIGS. 1 and 2. The interconnect member 622 is electrically connected to the conductive member of the gate stack 406. At a subsequent interconnect level (not illustrated), another interconnect member will be formed that is electrically connected to the interconnect member 622 and is part of a word line. The interconnect member 622 does not have corresponding contacts to the gate members of the gate stack 406 or any other gate member or gate electrodes within the NVM array. Outside the NVM array, the word lines may only contact source/drain regions of transistors within row or column decoders, row or column access (or address) strobes, or the like, and thus, the word lines may not contact, by itself or via conductive plugs, any gate members or gate electrodes within the electronic device.

The interconnect member 604 is electrically connected to the gate member of the gate stack 404 at the contact region 504 (not illustrated in FIG. 6) that includes the gate electrode for the access transistor. At a subsequent interconnect level (not illustrated), another interconnect member will be formed that are electrically connected to the interconnect members 604 and is a part of an access line. The lengths of interconnect members making up the access line and word line are substantially parallel to each other in a particular embodiment. The interconnect member 6244 is electrically connected to the source region 5244 (not illustrated in FIG. 6) of the access transistor and is part of a program line. The length of the interconnect member 6244 is substantially perpendicular to the lengths of the access and word lines.

The interconnect member 6262 is electrically connected to the drain region 5262 (not illustrated in FIG. 6) of the read transistor and is part of a bit line. The lengths of the interconnect members 6262 and 6244 (parts of bit line and word line, respectively) are substantially parallel to each other. The interconnect member 6264 is electrically connected to the source regions 5264 (not illustrated in FIG. 6) of the read transistor and is electrically connected to a ground terminal or a $V_{SS}$ terminal for the electronic device 300.

Further ILD layers and interconnect levels can be formed as needed or desired. Interconnect members that are parts of the program lines and further interconnect members that are parts of the word lines may be part of the same interconnect level or different interconnect levels. After all ILD layers and interconnect levels are formed, an encapsulating layer may be formed over the uppermost interconnect level to form a substantially completed electronic device.

Figure 7:
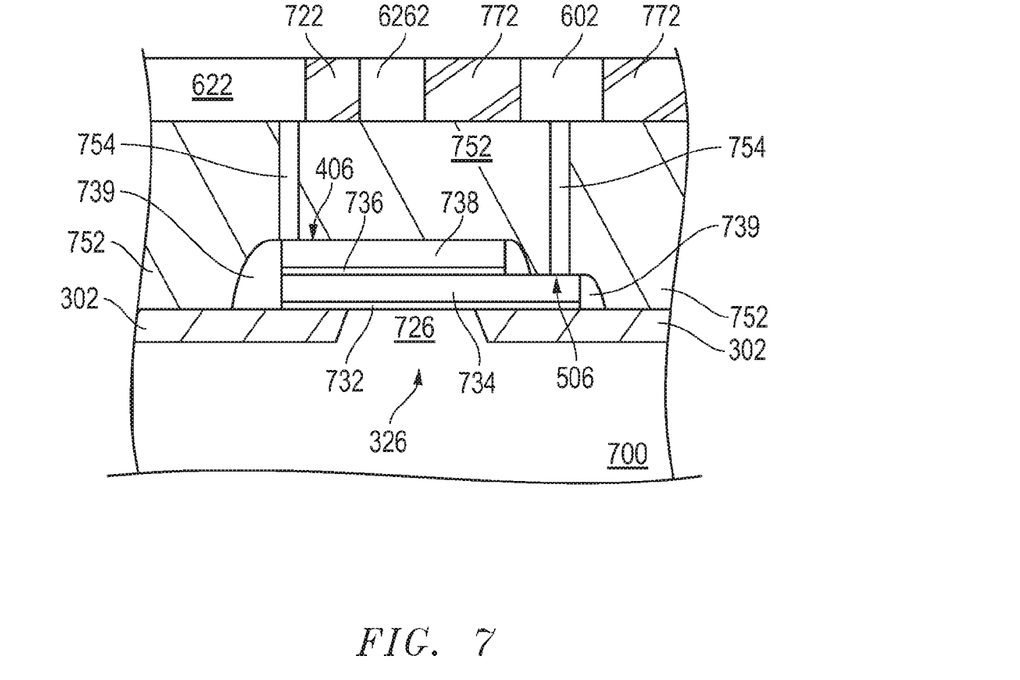
FIGS. 7 and 8 include illustrations of cross-sectional views of portions of the workpiece in FIG. 6.
Figure 8:
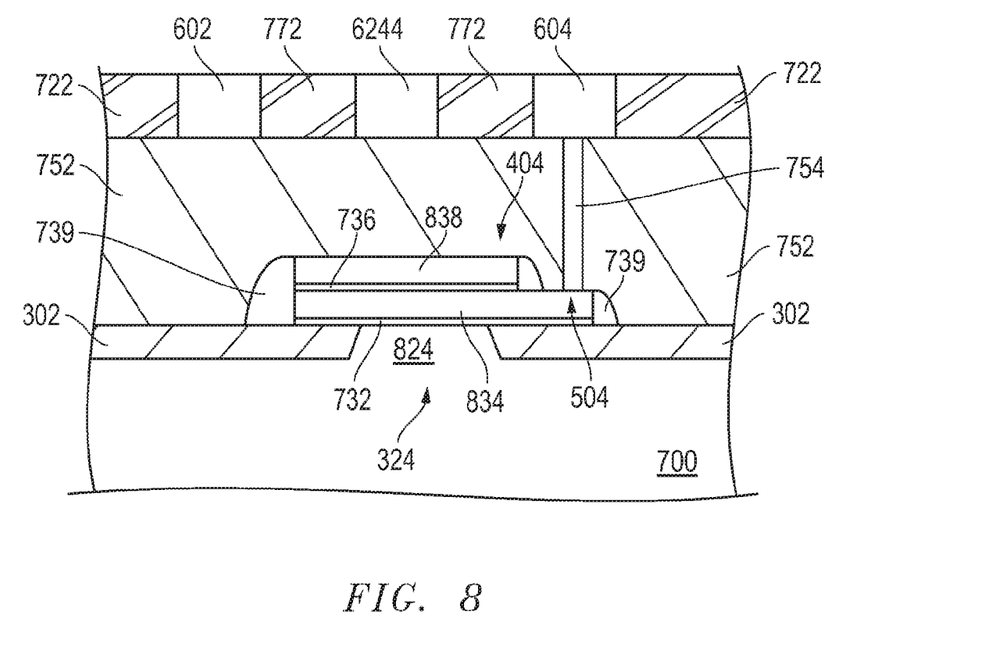

In accordance with exemplary embodiments, FIG. 7 includes an illustration of a cross-sectional view of an antifuse component and a read transistor, and FIG. 8 includes an illustration of a cross-sectional view of an access transistor. In FIG. 7, the gate stack 406 overlies a channel region 726 of the read transistor and includes a gate dielectric layer 732, a gate member 734, an antifuse dielectric layer 736, and a conductive member 738. In FIG. 8, the gate stack 404 overlies a channel region 824 of the access transistor and includes the gate dielectric layer 732, a gate member 834, the antifuse dielectric layer 736, and a conductive member 838. The gate stacks 404 and 406 are formed in accordance with any of the previously described embodiments. Extension portions of the source/drain regions are formed, the sidewall spacers 739 are then formed, and the heavily doped portions of the source/drain regions are then formed. The extension and heavily doped portions of the source/drain regions are not illustrated in FIGS. 7 and 8. An ILD layer 752 is formed and patterned to form contact openings. Conductive plugs 754 are then formed within the contact openings. Another ILD layer 772 is formed over the ILD layer 752 and conductive plugs 754 and is patterned to form interconnect trenches. Interconnect members as described with respect to FIG. 6 are then formed.

In FIG. 7, the gate member 734 includes a gate electrode for the read transistor and an electrode for the antifuse component. The conductive member 738 includes the other electrode for the antifuse component, and the antifuse dielectric layer is disposed between the electrodes of the antifuse component. Thus, the antifuse component overlies the channel region 724. The interconnect member 622 is electrically connected to the conductive member 738 via a conductive plug 754, and the interconnect member 602 is electrically connected to the gate member 734 at the corresponding contact region 506 via another conductive plug 754. During programming, the antifuse dielectric layer 736 between the conductive member 738 and the gate member 734 breaks down and allows current to flow to the gate member 734 and to the interconnect member 602 that is electrically connected to the drain region of the access transistor (not illustrated in FIG. 7). After the antifuse component is programmed, the gate electrode of the read transistor can be controlled by the word line.

In FIG. 8, the gate member 834 includes a gate electrode for the access transistor. The conductive member 838 is not electrically connected to any other part of the electronic device, and therefore, electrically floats. The other conductive members of the other gate stacks for the access transistors within the NMV array also electrically float. Note that the conductive member 838 is not used in determining the programming state of the NVM cell. The interconnect member 602 is electrically connected to the drain region 5242 of the access transistor, and the interconnect member 6244 is electrically connected to the source region 5244 of the access transistor, but the electrical connections are not seen in the cross-sectional view of FIG. 8.

After reading this specification, the embodiments as illustrated in FIGS. 7 and 8 are merely illustrative and not meant to limit the scope of the concepts as described herein. Another process sequence or another structure can be formed and not deviate from the concepts described herein. Note that gate dielectric layer 732, the antifuse dielectric layer 736, and sidewall spacers 739 as illustrated in FIGS. 7 and 8 may be present in FIGS. 4 to 6 but are not illustrated in FIG. 4, 5, or 6 to simplify the positional relationships between the gate stacks 404 and 406 and other features illustrated in FIGS. 4 to 6. If needed or desired, a self-aligned silicide process sequence can be performed to silicide portions (not illustrated) of the gate stacks 404 and 406, the drain region 5242, the source region 5244, the drain region 5262, and the source region 5264.

In an alternative embodiment, the doping to form source/drain regions may be performed after gate stacks, including the gate stacks 404 and 406, are formed and before removing portions of the conductive layer overlying contact regions, including the contact regions 504 and 506, of the gate members.

In another alternative embodiment, the process flow may be changed such that order for patterning to define the gate stacks and patterning to remove portions of the conductive layer from over the contact regions 504 and 506 and outside the NVM array are reversed. In a further alternative embodiment, separate masking layers can be used. In particular, a masking layer can be used to form the gate stacks within the NVM array, and a further masking layer can be used to form gate members outside the NVM array. Such a process sequence may allow for more process margin, but the additional masking layer may add to manufacturing costs.

In still further embodiment, the physical design can be modified to further decrease the cell size. The number of interconnect levels may affect the physical design and how much the cell size can be reduced. As illustrated, the NMV cell can be electrically connected to the proper connections with as little as two interconnect levels. If the number of interconnect levels is increased to three interconnect levels, the NVM cell can be further decrease in size. Referring to FIG. 5, the active region 324 can be reduced in length, and the gate stack 404 can be moved so that it is closer to the bottom of FIG. 5 as compared to the gate stack 406. The interconnect member 6264 may be include an extended portion that is connected to a source region of a read transistor of another NVM cell (not illustrated) below the NVM cell in FIG. 6. The access lines can be formed at a different interconnect level as compared to interconnect members that are electrically connected to ground terminal or a $V_{SS}$ terminal. After reading this specification, skilled artisans will appreciate that other physical designs can be used without departing from the scope of the concepts described herein.

After reading this specification, skilled artisans will appreciate the flexibility in implementing different physical designs and processing flows to allow an NVM array to be tailored to a particular application without departing from the concepts as described herein. The NVM array can be integrated into an existing logic process flow with no or only some changes. Because the NVM cells can be formed using an existing process flow with existing materials, NVM cells can be fabricated without having to develop exotic materials or using process steps that have little margin.

Many different aspects and embodiments are possible. Some of those aspects and embodiments are described below. After reading this specification, skilled artisans will appreciate that those aspects and embodiments are only illustrative and do not limit the scope of the present invention.

In a first aspect, an electronic device including a nonvolatile memory cell, wherein the nonvolatile memory cell can include an access transistor, a read transistor including a gate electrode, and an antifuse component coupled to the access transistor and the read transistor, wherein the antifuse component includes a first electrode and a second electrode overlying the first electrode. The gate electrode of the read transistor and the first electrode of the antifuse component can be parts of a first gate member.

In an embodiment of the first aspect, the read transistor includes source/drain regions and a channel region disposed between the source/drain regions, and the first and second electrodes of the antifuse component overlie the channel region. In another embodiment, a first conductive member overlies the first gate member and includes the second electrode of the antifuse component, and from a top view, the first gate member and the first conductive member have substantially a same shape except for a contact region of the first gate member. In a particular embodiment, the access transistor includes a gate electrode, source/drain regions, and a channel region disposed between the source/drain regions, and a second gate member includes a gate electrode of the access transistor. A second conductive member overlies the second gate member and the channel region of the access transistor; and from a top view, the second gate member and the second conductive member have substantially a same shape except for a contact region of the second gate member. In a further embodiment, the second electrode of the antifuse component is coupled to a source/drain region of the access transistor.

In a second aspect, an electronic device can include a nonvolatile memory cell. The nonvolatile memory cell can include an access transistor having a gate electrode, a read transistor, an antifuse component coupled to the access transistor and the read transistor, wherein the antifuse component includes a first electrode, an antifuse dielectric layer overlying the first electrode, and a second electrode overlying the antifuse dielectric layer; and a conductive member that overlies the antifuse layer and electrically floats.

In an embodiment of the second aspect, each of the access and read transistor includes a gate dielectric layer, and the antifuse dielectric layer has a lower dielectric breakdown voltage as compared to the gate dielectric layers of the access and read transistors. In a particular embodiment, the gate dielectric layers of the access and read transistors have substantially a same composition and substantially a same thickness. In another embodiment, the conductive member has substantially a same composition and substantially a same thickness as the second electrode of the antifuse component. In a particular embodiment, the gate electrodes of the access and read transistors have substantially a same composition and substantially a same thickness.

In a third aspect, a process of forming an electronic device including a nonvolatile memory cell can include forming a field isolation region over a substrate, wherein the field isolation region defines a first active region and a second active region spaced apart from each other, and forming a gate electrode layer over the field isolation region, the first active region, and the second active region. The process can also include forming a conductive layer over the gate electrode layer, patterning the conductive layer and the gate electrode layer to form a first gate stack and a second gate stack, and patterning the conductive layer to remove a portion of the conductive layer overlying the gate electrode layer. The first gate stack can include a first gate member and a first conductive member, and the second gate stack includes a second gate member, and the first gate member overlies a portion of the first active region and includes a gate electrode of a read transistor and a first electrode of an antifuse component. The first conductive member overlies the first gate member and includes a second electrode of the antifuse component; and the second gate member overlies a portion of the second active region and includes a gate electrode of an access transistor.

In an embodiment of the third aspect, the first conductive member overlies substantially all of the first gate member except for a contact region of the first gate member. In a particular embodiment, from a top view, the first conductive member and the first gate member have substantially a same shape except for a contact region of the first gate member. In another particular embodiment, patterning the conductive layer and the gate electrode layer also forms a second conductive member that overlies substantially all of the second gate member except for a contact region of the second gate member, and patterning the conductive layer to remove the portion of the conductive layer overlying the gate electrode layer is performed such that the portion is removed from over the contact region for the first gate member and another portion of the conductive layer is also removed and is removed from over a contact region of the second gate member. In a more particular embodiment, from a top view, the second conductive member and the second gate member have substantially a same shape except for the contact region of the second gate member.

In another embodiment of the third aspect, patterning the conductive layer and the gate electrode layer to form the first conductive member, the first gate member, and the second conductive member is performed before patterning the conductive layer to remove the portion of the conductive layer overlying the gate electrode layer. In still another embodiment, patterning the conductive layer to remove the portion of the conductive layer overlying the gate electrode layer is performed before patterning the conductive layer and the gate electrode layer to form the first conductive member, the first gate member, and the second conductive member.

In a further embodiment of the third aspect, the process further includes forming a gate dielectric layer over the active regions before forming the gate electrode layer, and forming an antifuse dielectric layer after forming the gate electrode layer and before forming the conductive layer. In a particular embodiment, the gate dielectric layer has a different thickness or a different composition as compared to the antifuse dielectric layer. In another particular embodiment, the antifuse dielectric layer has a lower dielectric breakdown voltage as compared to the gate dielectric layer.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A process of forming an electronic device comprising a nonvolatile memory cell comprising:

forming a field isolation region over a substrate, wherein the field isolation region defines a first active region and a second active region spaced apart from each other;

forming a gate electrode layer over the field isolation region, the first active region, and the second active region;

forming a conductive layer over the gate electrode layer;

patterning the conductive layer and the gate electrode layer to form a first gate stack and a second gate stack; and patterning the conductive layer to remove a portion of the conductive layer overlying the gate electrode layer, wherein:

the first gate stack includes a first gate member and a first conductive member, and the second gate stack includes a second gate member;

the first gate member overlies a portion of the first active region and includes a gate electrode of a read transistor and a first electrode of an antifuse component;

the first conductive member overlies the first gate member and includes a second electrode of the antifuse component; and the second gate member overlies a portion of the second active region and includes a gate electrode of an access transistor.

2. The process of claim 1, wherein the first conductive member overlies substantially all of the first gate member except for a contact region of the first gate member.

3. The process of claim 2, wherein, from a top view, the first conductive member and the first gate member have substantially a same shape except for a contact region of the first gate member.

4. The process of claim 2, wherein:
patterning the conductive layer and the gate electrode layer also forms a second conductive member that overlies substantially all of the second gate member except for a contact region of the second gate member; and
patterning the conductive layer to remove the portion of the conductive layer overlying the gate electrode layer is performed such that the portion is removed from over the contact region for the first gate member and another portion of the conductive layer is also removed and is removed from over a contact region of the second gate member.

5. The process of claim 4, wherein, from a top view, the second conductive member and the second gate member have substantially a same shape except for the contact region of the second gate member.

6. The process of claim 4, wherein patterning the conductive layer and the gate electrode layer to form the first conductive member, the first gate member, and the second conductive member is performed before patterning the conductive layer to remove the portion of the conductive layer overlying the gate electrode layer.

7. The process of claim 4, wherein patterning the conductive layer to remove the portion of the conductive layer overlying the gate electrode layer is performed before patterning the conductive layer and the gate electrode layer to form the first conductive member, the first gate member, and the second conductive member.

8. The process of claim 1, further comprising:
forming a gate dielectric layer over the active regions before forming the gate electrode layer; and
forming an antifuse dielectric layer after forming the gate electrode layer and before forming the conductive layer.

9. The process of claim 8, wherein the gate dielectric layer has a different thickness or a different composition as compared to the antifuse dielectric layer.

10. The process of claim 8, wherein the antifuse dielectric layer has a lower dielectric breakdown voltage as compared to the gate dielectric layer.

11. A process of forming an electronic device comprising a nonvolatile memory cell comprising:
forming a field isolation region over a substrate, wherein the field isolation region defines a first active region and a second active region spaced apart from each other;
forming a first transistor including first and second source/drain regions within the first active region and a first gate electrode overlying the first active region;
forming an antifuse component including a first electrode and a second electrode, wherein a first gate member includes the first gate electrode and the first electrode, and a conductive member includes the second electrode; and
forming a second transistor including third and fourth source/drain regions within the second active region and a second gate electrode overlying the second active region, wherein the third source/drain region is electrically connected to the first gate member.

12. The process of claim 11, wherein forming the first and second transistors are performed such that, from a top view, the first gate member extends beyond the conductive member.

13. The process of claim 11, wherein forming the antifuse component comprises:
depositing a conductive layer; and
patterning the conductive layer to define the conductive member, wherein another conductive member is also formed and overlies the second active region.

14. The process of claim 13, wherein the other conductive member electrically floats.

15. The process of claim 11, wherein the first transistor is a read transistor, and the second transistor is an access transistor.

16. The process of claim 15, wherein forming the antifuse component includes forming a capacitor.

17. The process of claim 11, further comprising forming an interconnect level including a first interconnect member that electrically connects the third source/drain region of the second transistor and the first gate member to each other.

18. The process of claim 17, wherein interconnect level includes a second interconnect member electrically connected to the second gate electrode of the second transistor, and a third interconnect member electrically connected to the fourth source/drain region of the second transistor.

19. The process of claim 18, wherein interconnect level includes a fourth interconnect member is electrically connected to the conductive member, a fifth interconnect member is electrically connected to the first source/drain region of the first transistor, and a sixth interconnect member is electrically connected to the second source/drain region of the first transistor.

20. The process of claim 19, wherein:
the second interconnect member is part of an access line;
the third interconnect member is part of a program line;
the fourth interconnect member is part of a word line;
the fifth interconnect member is part of a bit line; and
the sixth interconnect member is electrically connected to a ground or $V_{SS}$ terminal.

* * * * *